(12) United States Patent
Koga (10) Patent No.: US 6,649,500 B2
(45) Date of Patent: Nov. 18, 2003

(54) SEMICONDUCTOR DEVICE INCLUDING AN INSULATED GATE FIELD EFFECT TRANSISTOR AND METHOD OF MANUFACTURING THE SAME

(75) Inventor: Hiroki Koga, Tokyo (JP)

(73) Assignees: NEC Corporation, Tokyo (JP); NEC Electronics Corporation, Kanagawa (JP)

(*) Notice: Subject to any disclaimer, the term of this patent is extended or adjusted under 35 U.S.C. 154(b) by 0 days.

(21) Appl. No.: 09/991,093

(22) Filed: Nov. 13, 2001

(65) Prior Publication Data

US 2002/0079492 A1 Jun. 27, 2002

(30) Foreign Application Priority Data

Nov. 15, 2000 (JP) .................................. 2000-347716

(51) Int. Cl.⁷ .................. H01L 21/3205; H01L 21/4763
(52) U.S. Cl. .................. 438/585; 438/592; 438/586; 438/587; 438/588; 257/413
(58) Field of Search ................. 438/197–209, 438/581–583, 585–587, 588, 592; 257/262, 326, 368, 334, 347, 412–413

(56) References Cited

U.S. PATENT DOCUMENTS

| 4,753,896 A | * | 6/1988 | Matloubian | ................. 257/350 |
| 5,518,946 A | * | 5/1996 | Kuroda | ............. 148/DIG. 112 |
| 5,731,236 A | | 3/1998 | Chou et al. | |
| 5,817,562 A | | 10/1998 | Chang et al. | |
| 5,930,634 A | * | 7/1999 | Hause et al. | ................. 438/307 |
| 6,083,816 A | | 7/2000 | Kanamori | |
| 6,123,766 A | * | 9/2000 | Williams et al. | |
| 6,160,271 A | * | 12/2000 | Yamazaki et al. | .......... 257/350 |
| 6,187,676 B1 | * | 2/2001 | Kim et al. | |
| 6,200,840 B1 | * | 3/2001 | Chen et al. | |
| 6,258,675 B1 | * | 7/2001 | Gardner et al. | ............. 257/411 |
| 6,350,665 B1 | * | 2/2002 | Jin et al. | ..................... 438/305 |
| 6,436,818 B1 | * | 8/2002 | Hu et al. | |
| 2002/0001935 A1 | * | 1/2002 | Kim et al. | |
| 2002/0084482 A1 | * | 7/2002 | Kaya et al. | .................. 257/315 |

FOREIGN PATENT DOCUMENTS

| EP | 0849777 | | 6/1997 | |
| EP | 0849777 | * | 12/1997 | .......... H01L/21/28 |
| JP | 02-047871 | | 2/1990 | |
| JP | 07-183513 | * | 7/1995 | .......... H01L/29/78 |

OTHER PUBLICATIONS

English Bibliographies and Abstracts of JP 02–047871 and JP 07–183513 (noted above).

* cited by examiner

Primary Examiner—Phat X. Cao
Assistant Examiner—Thao X. Le
(74) Attorney, Agent, or Firm—Darryl G. Walker; Bradley T. Sako (57) ABSTRACT

A semiconductor device is disclosed including an IGFET (insulated gate field effect transistor) and a method of manufacturing the same. The semiconductor device may include an oxide film (115) or a nitride film (106) provided on a side surface of a gate electrode in such a manner that an overhang condition may not occur. In this way, operating characteristics of the IGFET may not be deteriorated and voids may not appear in filling regions of an interlayer insulating film so that isolation characteristics may not be deteriorated.

9 Claims, 11 Drawing Sheets

SEMICONDUCTOR DEVICE INCLUDING AN INSULATED GATE FIELD EFFECT TRANSISTOR AND METHOD OF MANUFACTURING THE SAME

TECHNICAL FIELD

The present invention relates generally to a semiconductor device and method for manufacturing the same, and more specifically to a semiconductor device including an insulated gate field effect transistor (IGFET) including a gate electrode that includes polysilicon and metal or metal silicide having a high melting point and a method of manufacturing the same.

BACKGROUND OF THE INVENTION

In order to improve the integration of a semiconductor device it is desirable to make smaller contact holes for a contact electrode to provide a connection between wiring layers and source/drain regions of a metal oxide semiconductor field effect transistor (MOSFET). It is also desirable to make the contact holes having improved accuracy of placement. In order to do this, a technique for forming a contact hole and electrode has been developed and is known as a self aligned contact (SAC).

Figure 9:
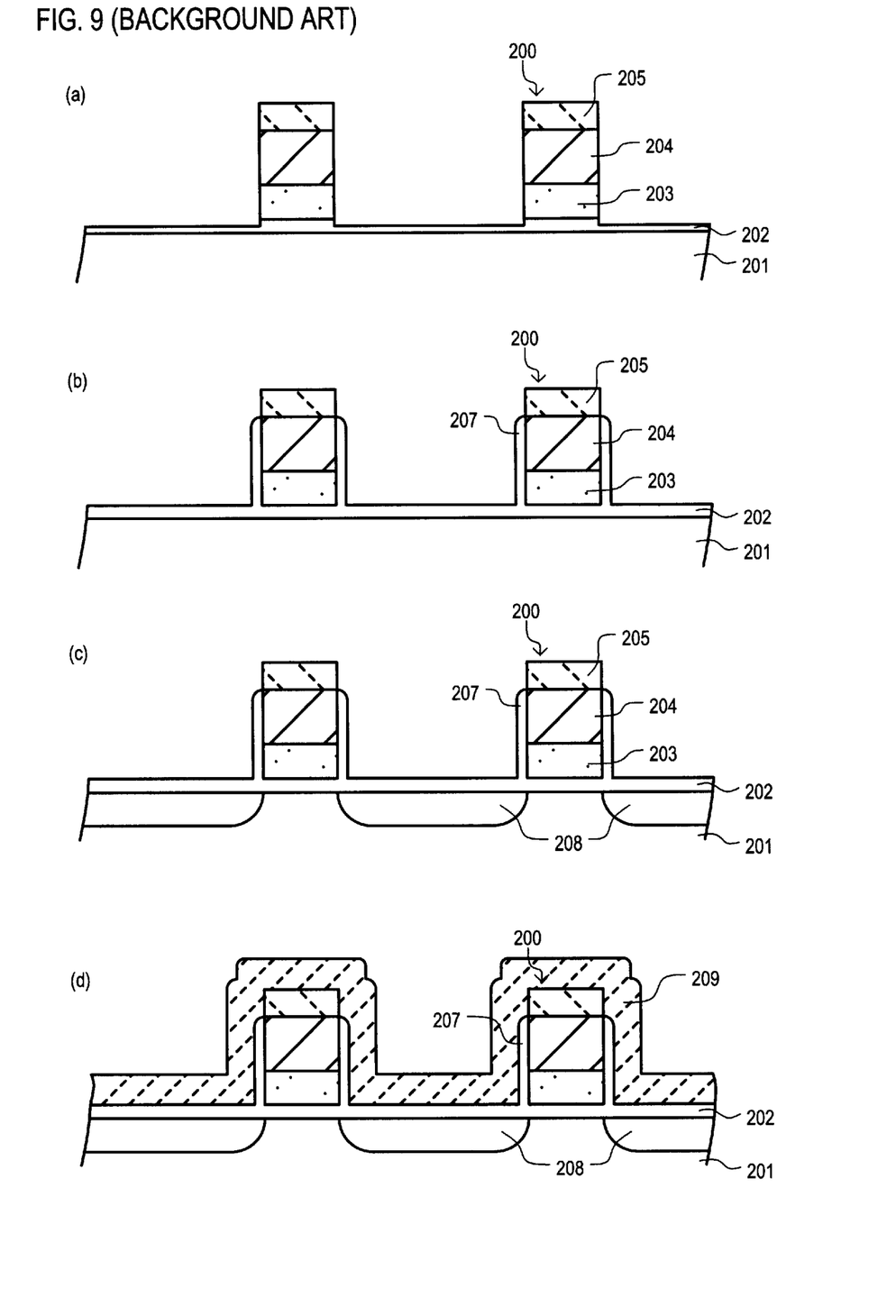
FIG. 9 is cross-sectional views of a conventional manufacturing method of conventional semiconductor device having SAC technique after various processing steps.
Figure 10:
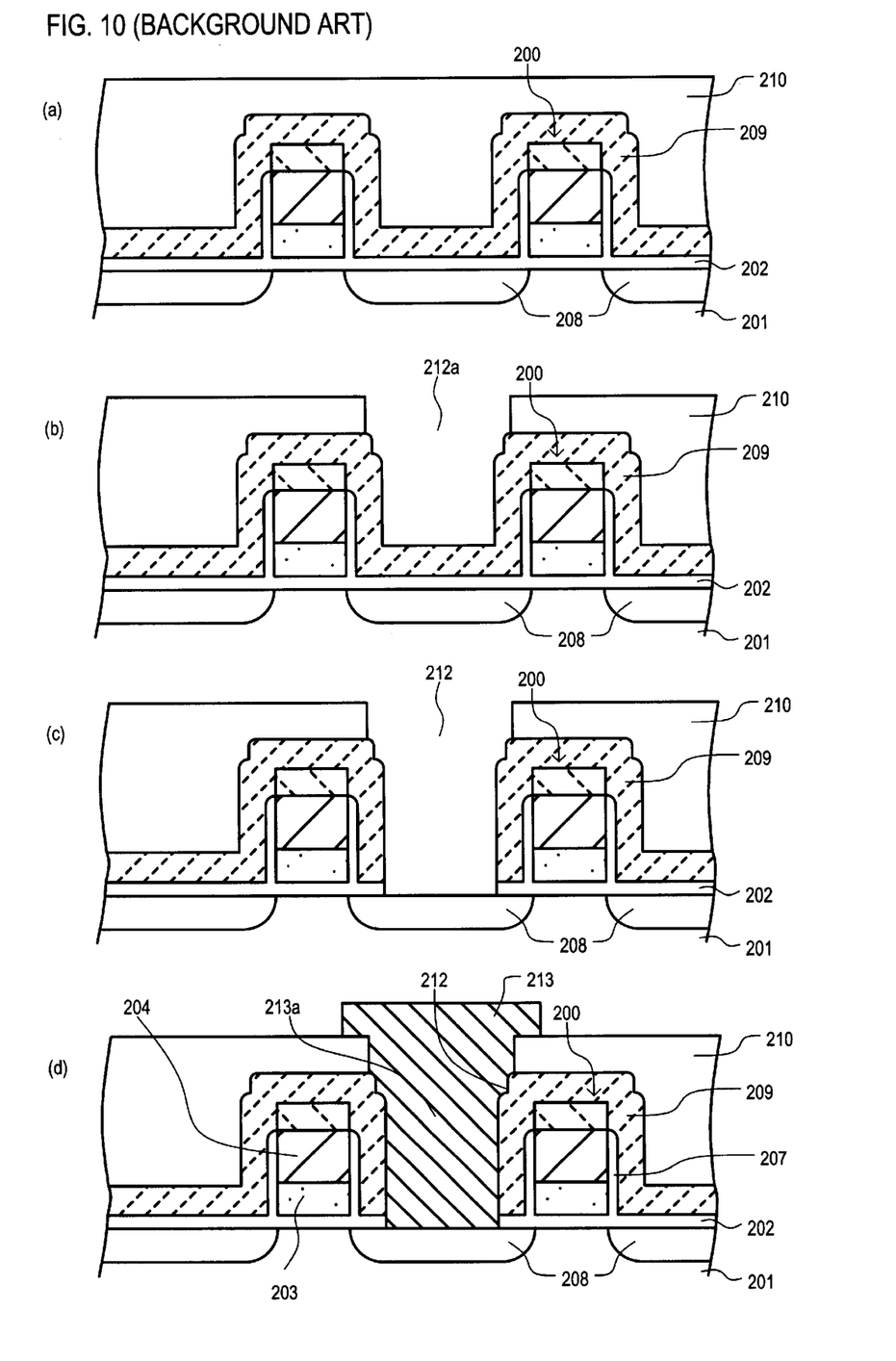
FIG. 10 is cross-sectional views of a conventional manufacturing method of conventional semiconductor device having SAC technique after various processing steps.

Referring to FIGS. 9 and 10, cross-sectional views of a conventional manufacturing method of conventional semiconductor device having SAC technique after various processing steps are set forth.

Referring now to FIG. 9(a), gate insulating film 202 consisting of silicon oxide (such as $SiO_2$) is formed on the surface of silicon substrate 201. A laminated film consists of poysilicon film 203, WSi (tungsten silicide) film 204, and a cap film 205 consisting of a silicon nitride (such as $Si_3N_4$) film. Using a photolithography technique, cap film 205, WSi film 204, and polysilicon film 203 are etched into a desired pattern to form gate electrode 200.

In regions other than the gate electrode, the surface of gate insulating film 202 is also etched and made thinner. Thus, the film thickness of gate insulating film 202 is increased by thermal oxidation to replace the etched portions. As illustrated in FIG. 9(b), during this step, a silicon oxide side wall film 207 is formed on the side surface of gate electrode 200.

As illustrated in FIG. 9(c), the surface of silicon substrate is subjected to ion implantion with an impurity to form source drain regions 208 with a self alignment method in which gate electrode 200 is used as a mask. In this way, a MOS type transistor is formed.

Referring now to FIG. 9(d), silicon nitride film 209 is formed with a chemical vapor deposition (CVD) method. Silicon nitride film 209 serves as an etching stopper film.

Referring now to FIG. 10(a), interlayer insulating film 210 such as a BPSG (Boro-PhosphoSilicate Glass) film is formed on the entire surface to cover gate electrode and provide a flat surface.

Referring to FIG. 10(b), a hole 212a is opened in interlayer insulating film 210 over the source/drain region 208 using a photolithography technique. When forming hole 212a, etching stopper film 209 formed on the side surface of gate electrode 200 is not etched. Only interlayer insulating film 210 composed of BPSG is etched based on a difference of a selective etching ratio between etching stopper film 209 and interlayer insulating film 210.

Referring now to FIG. 10(c), an anisotropic etching is applied to etching stopper film 209 exposed in hole 201a.

Further etching is applied to gate insulating film 202. In this way, contact hole 212 is opened with a SAC technique.

Next, as illustrated in FIG. 10(d), a wiring electrode 213a is formed in contact hole 212 to provide an electrical connection between a top part of wiring electrode 213 and source/drain region 208. Because contact hole 212 is formed using a SAC technique with etching stopper film 209 on the side surface of gate electrode 200, the MOS type element can be made fine. Even if a mask for opening a contact hole is out of position, side wall film 207 is not etched due to the etching stopper film 209. Thus, upper layer electrode 204 and lower layer electrode 203 of gate electrode 200 can be prevented from being exposed in contact hole 212. Thus, a margin for positioning the mask for the contact hole 212 can be increased and yield may be improved.

Figure 11:
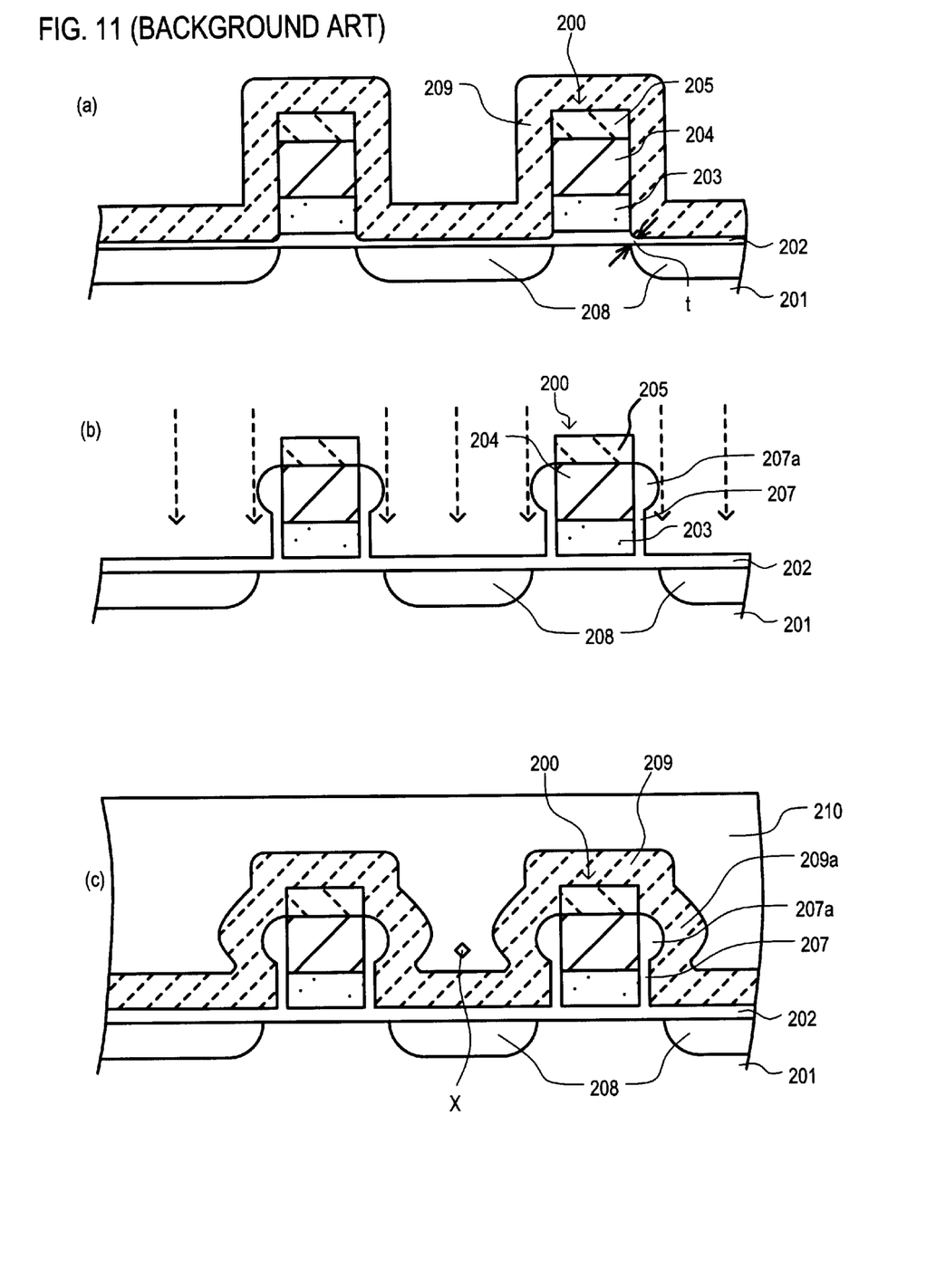
FIG. 11 is cross-sectional views of a conventional manufacturing method of conventional semiconductor device having SAC technique after various processing steps.

FIG. 11 are cross-sectional views of a conventional manufacturing method of conventional semiconductor device having SAC technique after various processing steps are set forth. FIG. 11(a) illustrates a reduced distance between the stopper film 209 and the surface of the silicon substrate 201 in a region close to the edge of lower layer electrode 203. FIG. 11(b) illustrates an overhang in a side wall oxide layer. FIG. 11(c) illustrates a void in a BPSG interlayer insulating film.

In the formation of a contact electrode using the conventional SAC technology, a thermal oxidation step is performed as illustrated in FIG. 9(b). This thermal oxidation step is necessary because the gate insulating film 202 is partially etched and made thinner during the etching of cap film 205, upper layer electrode 204, and lower layer electrode 203 when forming the gate electrode 200. If the silicon nitride film (stopper film 209) is formed after the above-mentioned etching step without the additional thermal oxidation step, a distance between the stopper film 209 and the surface of the silicon substrate 201 in a region close to the edge of lower layer electrode 203 is reduced. This reduced distance is illustrated in FIG. 11(a) as a reduced interval t. Hot carriers are likely to be trapped in an interface between the silicon nitride film (stopper film 209) and the silicon oxide film (gate insulating film 202). This can change the value of the threshold voltage of the MOS type transistor, thus making it difficult to manufacture a MOS type transistor in accordance to the designed values. To solve this problem, the thermal oxidation step is performed as illustrate in FIG. 9(b) and the thickness of gate insulating film 202 is increased. This may prevent variations of the threshold value caused by hot carriers being trapped in the interface between the silicon nitride film (stopper film 209) and the silicon oxide film (gate insulating film 202) so that the desired characteristics of the MOS transistor can be achieved.

A technique of thermal oxidation including the side surface of the gate electrode has been proposed by the applicant and disclosed in Japanese Laid-Open Patent Publication No. 02-47871.

Thermal oxidation treatment for increasing the thickness of gate insulating film 202 causes side surfaces of the polysilicon film (lower layer electrode 203) and the WSi film (upper layer electrode 204) to be oxidized simultaneously. In this way, silicon oxide film (side wall film 207) is formed as illustrated in FIG. 9(b).

However, a silicide material, such as WSi (upper layer electrode 204) may be more likely to be oxidized than polysilicon (lower layer electrode 203) depending on the oxidation condition. Accordingly, depending upon the oxidation condition in the step illustrated in FIG. 9(b), side wall film 207 may become thicker on the side surface of upper layer electrode 204 than on the side surface of lower layer electrode 203 as illustrated with side wall film 207 in FIG. 11(b). In this case, side wall film 207 may include an overhang portion 207a that protrudes laterally from upper layer electrode 204.

When there is an overhang portion 207a protruding from a side wall film 207, the regions around the sides of gate electrode 200 are shielded during the ion implantation step as illustrated in FIG. 11(b). This can prevent regions of the source/drain region 208 near the edges of the gate electrode 200 from being sufficiently ion implanted with an impurity. This can cause an increased diffusion layer resistance of the source/drain region 208 located in the vicinity of the gate electrode 200 and adversely affect characteristics of the MOS transistor.

Also, a side wall film 207 including an overhang portion 207a on the side surface of upper layer electrode 204 can cause the CVD silicon nitride film (etching stopper film 209) in FIG. 9(d) to include a protruding portion 209a as illustrated in FIG. 11(c). Thus, when BPSG interlayer insulating film 210 is formed, the protruding portion 209a can make it difficult to fill the central region of the contact hole and a void X is likely to be formed as illustrated in FIG. 11(c). If the void X is formed in interlayer insulating film 210, a short-circuit can occur in adjacent contact holes (such as contact hole 212 in FIG. 10(c)) during the contact forming process. This reduces the yield of the product and increases manufacturing costs.

In light of the above discussion, it would be desirable to provide a semiconductor device, which may include a side wall film, such as a silicon oxide film or silicon nitride film, on the side surface of a gate electrode that may not have an overhang portion. It would also be desirable to provide an insulated gate field effect transistor (IGFET) that does not have characteristics affected by an overhang portion of a side wall film. It would also be desirable to provide a manufacturing method for the semiconductor device.

SUMMARY OF THE INVENTION

A semiconductor device according to the present embodiments may include an IGFET (insulated gate field effect transistor) and a method of manufacturing the same. The semiconductor device may include an oxide film or a nitride film provided on a side surface of a gate electrode in such a manner than an overhang condition may not occur. In this way, operating characteristics of the IGFET may not be deteriorated and voids may not appear in filling regions of an interlayer insulating film so that isolation characteristics may not be deteriorated.

According to one aspect of the embodiments, a semiconductor device may include an IGFET including a gate electrode that may include a lower layer electrode formed on a gate insulating film and an upper layer electrode formed on the lower layer electrode. A cap film may be formed on the upper layer electrode. A first nitride film may be formed on a side surface of the upper layer electrode. An oxide film may be formed on a side surface of the lower layer electrode. An etching stopper film may include a second nitride film formed on the outside of the first nitride film and oxide film.

According to another aspect of the embodiments, the first nitride film may be a thermal nitride film.

According to another aspect of the embodiments, the first nitride film may be a rapidly heated thermal nitride film.

According to another aspect of the embodiments, the first nitride film may have a thickness of approximately 2 to 5 nm.

According to another aspect of the embodiments, an interlayer insulating film may be formed to cover the gate electrode of the IGFET. A contact hole may be opened in the interlayer insulating film to expose a source/drain region of the IGFET. A conductor may fill the contact hole and be electrically connected with the source/drain region.

According to another aspect of the embodiments, the oxide film may be a thermal oxide film.

According to another aspect of the embodiments, the second nitride film may be formed with chemical vapor deposition (CVD).

According to another aspect of the embodiments, a method for manufacturing a semiconductor device including an IGFET may include the steps of forming a gate insulating film on a semiconductor substrate, forming a laminate film on the gate insulating film where the laminate film may include an insulating film formed on a second conductive film formed on a first conductive film, etching the insulating film and the second conductive film into a predetermined pattern to form a cap film and an upper layer gate electrode, forming a first nitride film on the side surface of the upper layer gate electrode, etching the first conductive film using the cap layer, upper layer gate electrode and the nitride film as a mask to form a lower layer gate electrode, forming a first oxide film on the side surface of the lower layer electrode, and forming an etching stopper film including a second nitride film over the entire surface.

According to another aspect of the embodiments, the first conductive film may be a polysilicon film and the second conductive film may be a metal film.

According to another aspect of the embodiments, the first conductive film may include a polysilicon film and the second conductive film may include a metal silicide film having a high melting point.

According to another aspect of the embodiments, the first nitride film may be a thermal nitride film and the first oxide film may be a thermal oxide film.

According to another aspect of the embodiments, forming the etching stopper film may include forming the second nitride film with a chemical vapor dposition.

According to another aspect of the embodiments, the first nitride film may be a thermal nitride film formed with a rapid thermal nitridation step using a lamp as a heat source.

According to another aspect of the embodiments, a method for manufacturing the semiconductor device may include the steps of forming a source/drain region by doping an impurity into the semiconductor substrate after the step of forming the first oxide film and forming an interlayer insulating film over the entire surface and selectively etching the interlayer insulating film with a selective etching ratio for the etching stopper film to open a contact hole after the step of forming the etching stopper film.

According to another aspect of the embodiments, a method for manufacturing the semiconductor device may include the steps of forming a lightly doped drain (LDD) region by doping a first impurity concentration into the semiconductor substrate after the step of forming the first oxide film, anisotropic etching the etching stopper film to form a side wall etching stopper film on side surfaces of the lower layer gate electrode, upper layer gate electrode, and cap layer, and forming a source/drain region by doping a second impurity concentration into the semiconductor substrate using the side wall etching stopper film as a mask. The first impurity concentration may be lower than the second impurity concentration.

According to another aspect of the embodiments, a method for manufacturing the semiconductor device may include the steps of forming a second oxide film over the entire surface of the substrate with a chemical vapor deposition method, anisotropic etching the second oxide film to form a side oxide film on the side surface of the etching stopper film, and forming the source/drain region after the step of forming the side wall.

According to another aspect of the embodiments, a semiconductor device may include a first region and a second region. A first gate electrode of a first IGFET in the first region may have a first lower layer electrode formed on a first gate insulating film and a first upper layer electrode formed on the first lower layer electrode. A first cap film may be formed on the first upper layer electrode. A first nitride film may be formed on a side surface of the first upper layer electrode. A first oxide film may be formed on a side surface of the first lower layer electrode. A first etching stopper film may include a second nitride film formed on the outside of the first nitride film and first oxide film. A second gate electrode of a second IGFET in the second region may have a second lower layer electrode formed on a second gate insulating film and a second upper layer electrode formed on the second lower layer electrode. A second cap film may be formed on the second upper layer electrode. A third nitride film may be formed on a side surface of the second upper layer electrode. A second oxide film may be formed on a side surface of the second lower layer electrode. A second etching stopper film may include a fourth nitride film formed on the outside of the third nitride film and second oxide film. The first IGFET may include a lightly doped drain.

According to another aspect of the embodiments, the semiconductor device may be a semiconductor memory device.

According to another aspect of the embodiments, the first region may be a memory cell region and the second region may be a peripheral circuit region.

According to another aspect of the embodiments, a first contact may provide an electrical connection to a first sour/drain region of the first IGFET. A second contact may provide an electrical connection to a second source/drain region of the second IGFET. A first spacing from the first contact to the first electrode may be greater than a second spacing from the second contact to the second gate electrode.

DETAILED DESCRIPTION OF THE EMBODIMENTS

Various embodiments of the present invention will now be described in detail with reference to a number of drawings.

Figure 1:
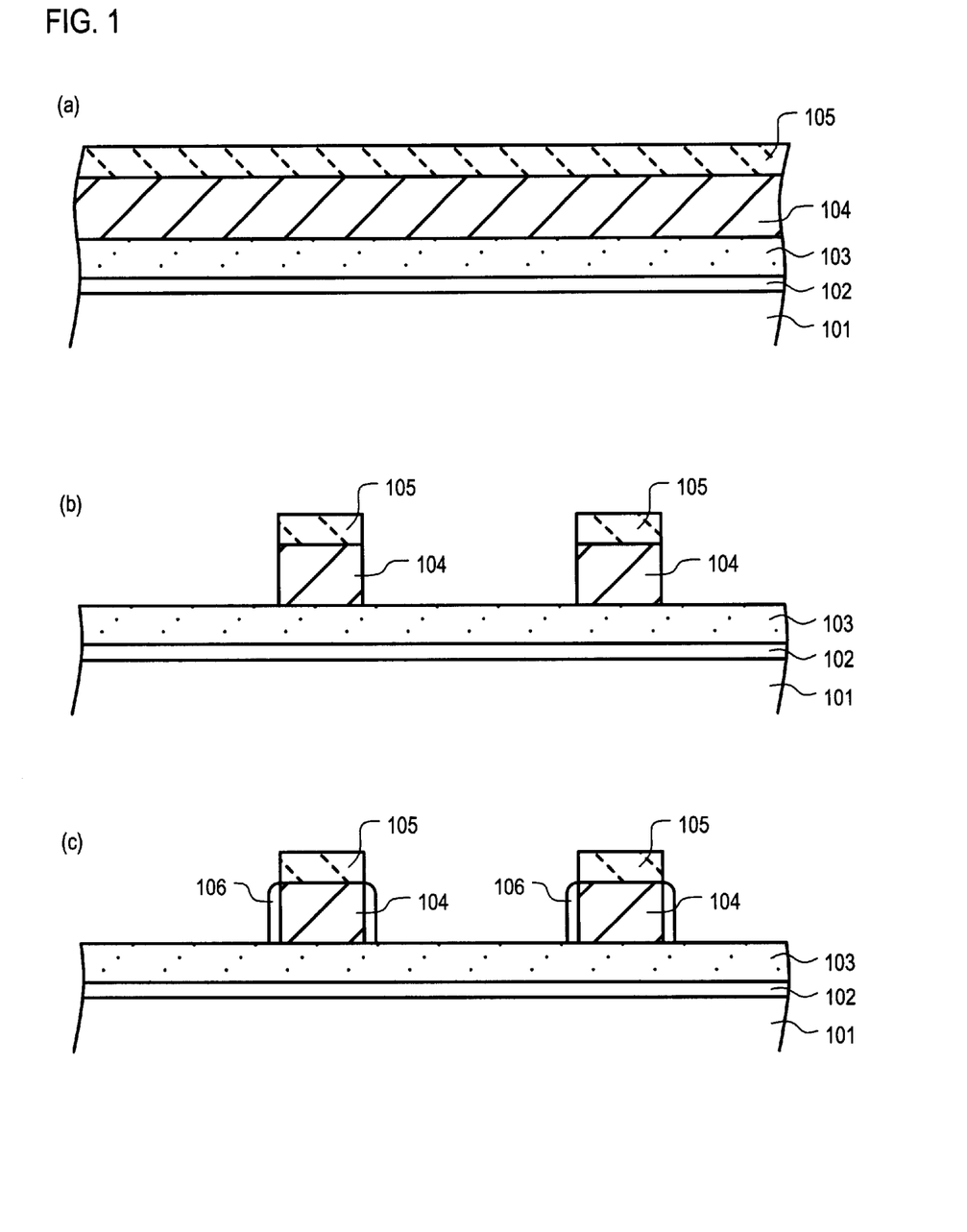
FIG. 1 is cross-sectional views of a semiconductor device according to a first embodiment after various processing steps.
Figure 2:
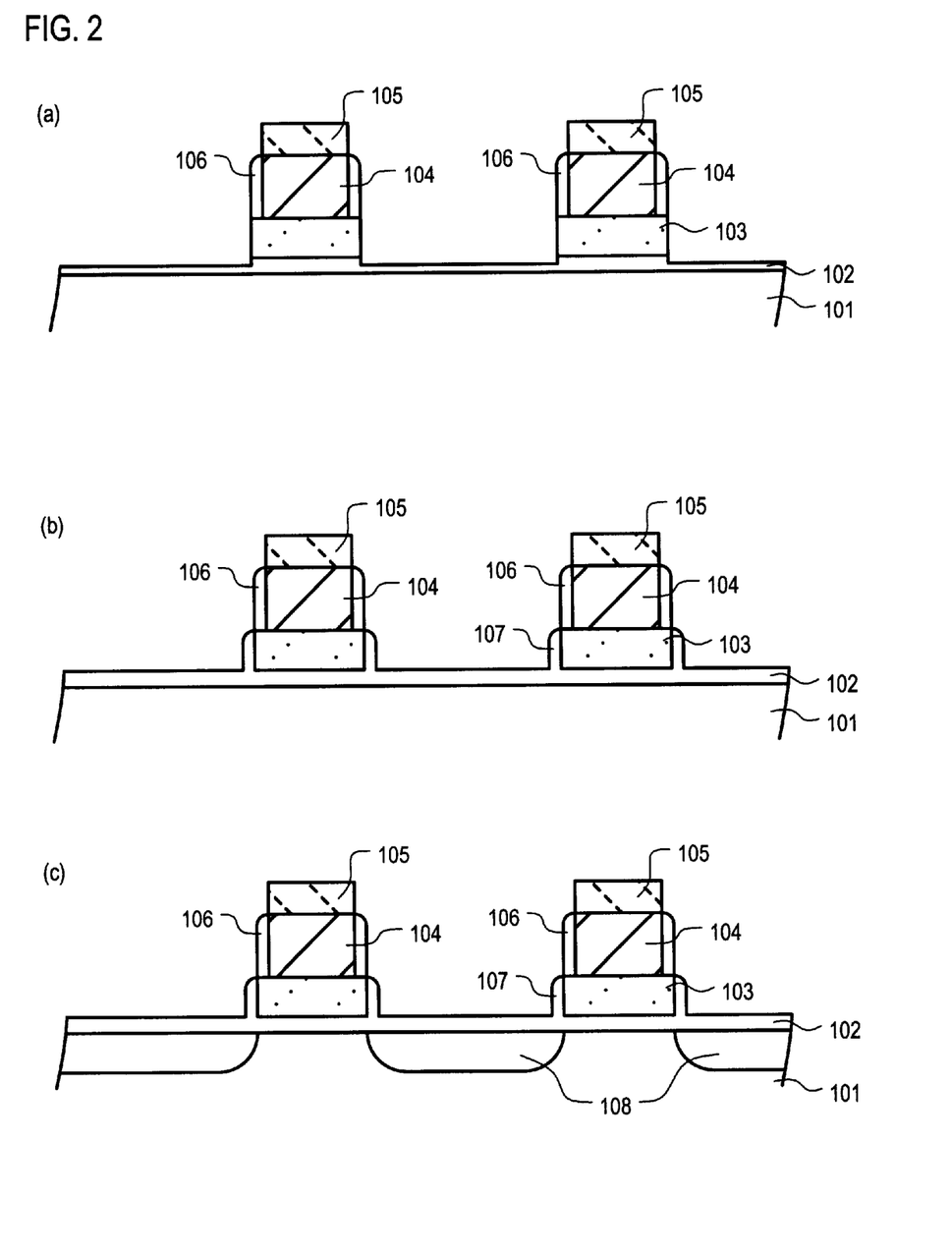
FIG. 2 is cross-sectional views of a semiconductor device according to a first embodiment after various processing steps.
Figure 3:
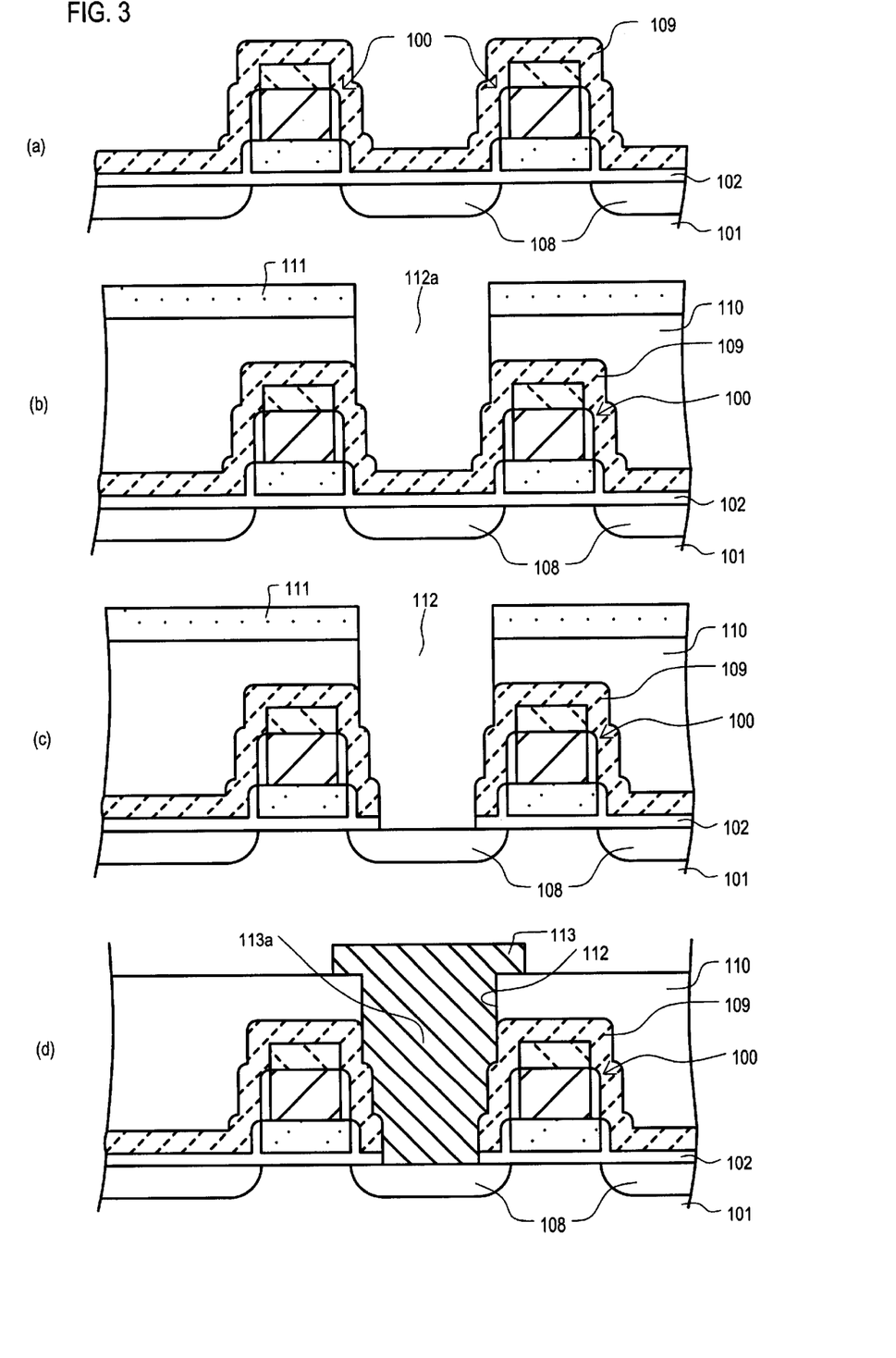
FIG. 3 is cross-sectional views of a semiconductor device according to a first embodiment after various processing steps.

FIGS. 1 to 3 are cross-sectional views of a semiconductor device according to a first embodiment after various processing steps.

Referring now to FIG. 1(a), the surface of a silicon substrate 101 may be thermally oxidized to form silicon oxide film 102 (such as $SiO_2$). Silicon oxide film 102 may have a film thickness of approximately 10 nm and may be used as a gate insulating film. Then, polisilicon film 103 may be formed on the silicon oxide film 102 with a low pressure chemical vapor deposition (LPVD) method. Polysilicon film 103 may have a thickness of approximately 100 nm. A WSi film (tungsten silicide film) 104 may then be formed on the polysilicon film 103 with a CVD method. WSi film 104 may have a thickness of approximately 150 nm. Then silicon nitride film (such as $Si_3N_4$) 105 may be formed on the WSi film 104 with a sputtering method or a CVD method. Silicon nitride film 105 may have a thickness of about 100 nm.

Referring now to FIG. 1(b), a mask including photoresist (not shown) may be formed on the silicon nitride film 105 and silicon nitride film 105. WSi film 104 may be etched into a desired pattern using the mask. In this way, cap film 105 and upper layer electrode 104 may be formed. Upper layer electrode 104 may form a portion of a gate electrode.

After the mask is removed, a RTN (Rapid Thermal Nitridation) process may be performed as illustrated in FIG. 1(c). The RTN process may be performed using a lamp as a heat source. In this way, a side anti-oxidizing film 106 may be formed on the side surface of upper layer electrode 104. Side anti-oxidizing film 106 may be a silicon nitride film and may have a thickness of approximately 2–5 nm. A thin RTN silicon nitride film (not shown) may also be formed on the surface of the exposed polysilicon film 103. Conditions of RTN may include ammonia ($NH_3$) gas flow rate of 5 to 10 (liters/minute) at 800 to 1000° C. for 30 to 120 seconds, for example.

Referring now to FIG. 2(a), polysilicon film 103 may be etched in self-alignment with respect to cap film 105, upper layer electrode 104, and side surface anti-oxidizing film 106. The RTN silicon nitride film on the upper surface of polysilicon film 103 may be etched and removed at the same time by a method such as anisotropic RIE (reactive ion etch), while cap film 105 and anti-oxidizing film 106 on the side surface of upper layer electrode 104 may not be etched. Also, polysilicon film 103 may remain behind under the upper layer electrode 104 and side anti-oxidizing film 106 to form lower layer electrode 103. In this way, a gate electrode 100 may be formed including cap film 105, upper layer electrode 104, and lower layer electrode 103. The surface of gate insulating film 102 may be etched to reduce the film thickness in a region other than under the lower layer electrode 103.

Referring now to FIG. 2(b), a RTO (Rapid Thermal Oxidation) process may be performed to oxidize the side surface of lower electrode 103 and the surface of gate insulating film 102 to form side oxidation film 107. The RTO process may use a lamp as a heat source. Side oxidation film 107 may have a thickness of approximately 5 nm on the side surface of lower layer electrode 103. Gate insulating film 102 may return to essentially its initial film thickness of approximately 10 nm. Conditions of RTO may include an oxygen ($O_2$) gas flow rate of 5 to 10 (liters/minute) at 900 to 1100° C. for 30 to 120 seconds, for example. Silicon nitride cap film 105 may be formed on the upper surface of upper layer electrode 104 and RTN silicon nitride anti-oxidizing film 106 may be formed on the side surface of upper layer electrode 104 so that the upper surface and side surface of upper layer electrode 104 may be prevented from being oxidized. Thus, a thick silicon oxide film may not be formed on the side surface. Even if upper layer electrode 104 is oxidized, silicon oxide film formed here may be so thin that it may be ignored as compared with anti-oxidizing film 106. In this way, gate electrode 100 may be formed with the above-mentioned process.

Referring now to FIG. 2(c), the surface of silicon substrate 101 may be ion implanted with an impurity at low concentration with a self-alignment method using gate electrode 100 as a mask. In this way, source/drain regions 108 may be formed.

Referring now to FIG. 3(a), silicon nitride film 109 may be formed over the entire surface with a CVD method. Silicon nitride film 109 may have a thickness of approximately 50 nm and may serve as an etching stopper film 109 covering the upper and side surfaces of gate electrode 100.

Referring now to FIG. 3(b), an interlayer insulating film 110 may be formed to cover and flatten the entire surface including gate electrode 100. Interlayer insulating film 110 may be a BPSG film. Then, a mask 111 may be formed having an opening over a region corresponding to a source/drain region 108. Interlayer insulating film 110 may then be etched to form hole 112a. When the forming of hole 112a, a selective etching process for oxide film may be performed under conditions of selective etching ratio of the BPSG as interlayer insulating film 110 and CVD silicon nitride as etching stopper film 109. In this way, only interlayer insulating film 110 may be etched without significantly etching the etching stopper film 109.

Referring now to FIG. 3(c), stopper film 109 is etched at a bottom surface of hole 112a. Only etching stopper film 109 exposed at a bottom surface of hole 112a may be etched by using an anisotropic etching process for a nitride film. Also, gate insulating film 102 comprising silicon oxide under the etching stopper film 109 at the bottom surface of hole 112a may be etched with an etching process for oxide film. In this way, contact hole 112 may be formed with a SAC method and silicon substrate 101 including source/drain region 108 may be exposed. Accordingly, with the SAC method, even if the opening in mask 111 may be overlapped on gate electrode 100, upper and lower layer electrodes (104 and 103) may be prevented from being exposed in contact hole 112 during the formation of contact hole 112.

Referring now to FIG. 3(d), polysilicon doped with an impurity may be formed on interlayer insulating film 110 including contact hole 112. Polysilicon may be patterned and etched with a mask (not shown) to form a wiring electrode 113. Wiring electrode 113 may include a contact electrode 113a formed in contact hole 112. In this way, contact electrode 113a may provide an electrical connection between source drain/region 108 of an insulated gate field effect transistor (IGFET) and wiring electrode 113. The IGFET formed may be a metal oxide semiconductor field effect transistor (MOSFET), as just one example.

In the semiconductor device including an IGFET formed as mentioned above, during the formation of gate electrode 100, upper layer electrode 104 may be first formed, anti-oxidizing film 106 including silicon nitride may be formed on the side surface of upper layer electrode 104 with RTN, then lower layer electrode 103 may be formed by self-alignment with upper layer electrode 104 and anti-oxidizing film 106. Side surface oxide film 107 may be formed on the side surface of lower layer electrode 103 with RTO while the thickness of gate insulating film 102 may be returned to approximately an initial thickness. Thus, side surface oxide film 107 on the side surface of lower layer electrode 103 may protrude from the side of lower layer electrode 103 by its own thickness farther than anti-oxidizing film 106 from the side surface of upper layer electrode 104. Because the side surface of upper layer electrode 104 may be covered with anti-oxidizing film 106, the side surface of upper layer electrode may not be oxidized during the RTO. In this way, the overhang state in which the side surface of upper layer electrode 104 protrudes beyond the side surface of lower layer electrode 103 may be prevented.

Accordingly, when source/drain region 108 is formed by ion implantation of impurity under self-alignment with the upper layer electrode 104, lower layer electrode 103, and anti-oxidizing film 106 and/or side surface oxide film 107, no portion of the desired source/drain region 108 in the vicinity of the gate electrode may be shielded so that ions may be prevented from being implanted. Thus, the impurity diffusion resistance of the source/drain region 108 in the vicinity of gate electrode may be prevented from increasing. Also, when BPSG interlayer insulating film 110 is formed after CVD silicon nitride etching stopper film 109 that covers gate electrode 100 is formed, a void may not occur in a region close to the gate electrode 100. Even when contact hole 112 and contact electrode 113a are formed, wiring isolation properties of interlayer insulating film 110 may be prevented from suffering adverse affects due to unwanted voids in filling regions. In this way, characteristics of the IGFET formed may be prevented from being adversely affected.

Although in the aforementioned embodiment cap film 105 may be formed with a silicon nitride film, it may also be formed with a silicon oxide film, as just one example. Even if cap film 105 is formed with a silicon oxide film, etching stopper film 109 including the CVD silicon nitride film may be formed on cap film 105. Thus, cap film 105 may be prevented from being etched even if mask 111 is out of position when etching to open contact hole 112 in interlayer insulating film 110. Hence, upper layer electrode 104 may be prevented from being exposed in contact hole 112.

A second embodiment of the present invention will now be described with reference to FIGS. 4 to 6. The second embodiment is an example where the present invention may be applied to a lightly doped drain (LDD) structure IGFET. Constituents in the second embodiment that are similar to constituents in the first embodiment may be given the same general reference character.

Figure 4:
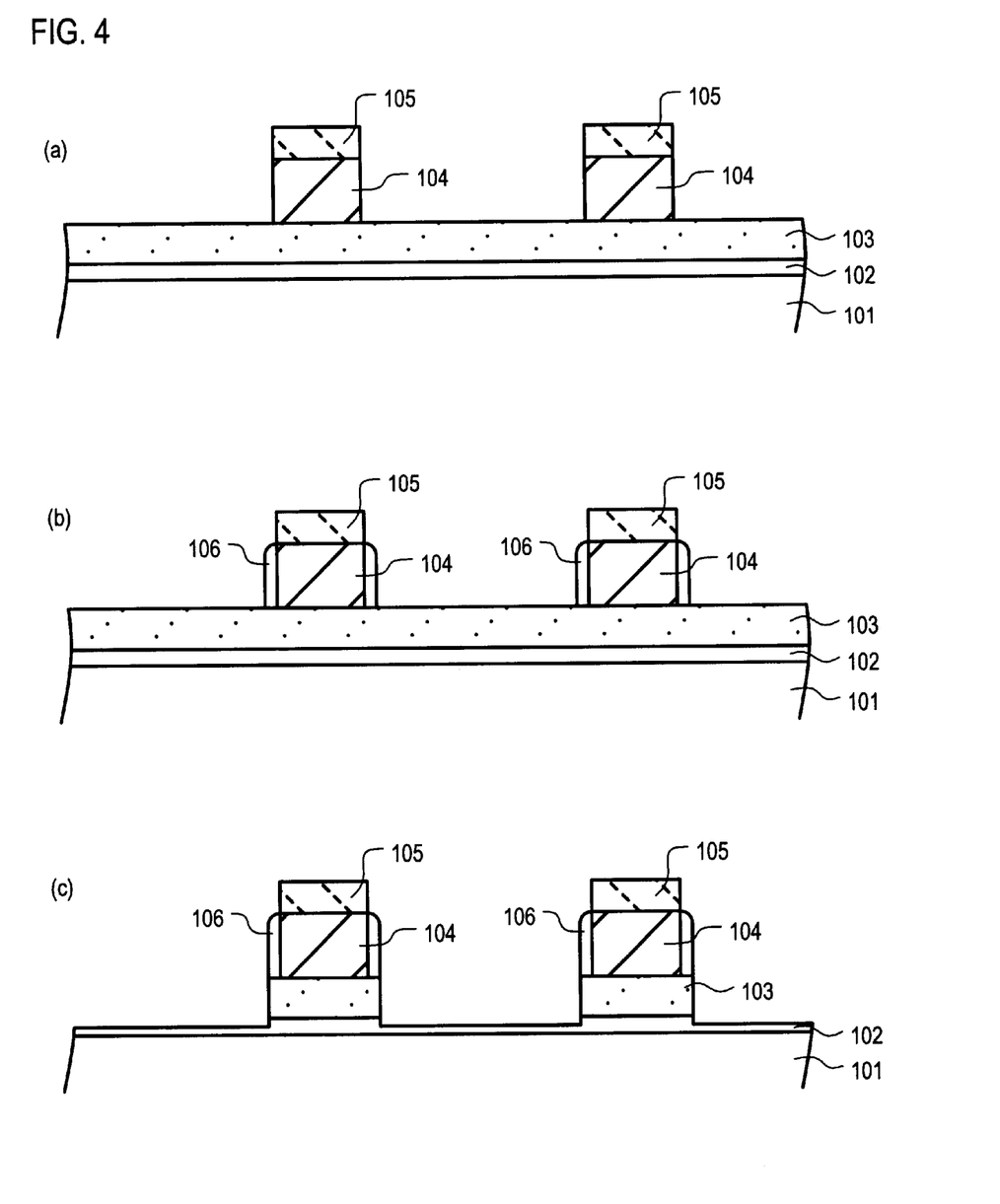
FIG. 4 is cross-sectional views of a semiconductor device according to a second embodiment after various processing steps.
Figure 5:
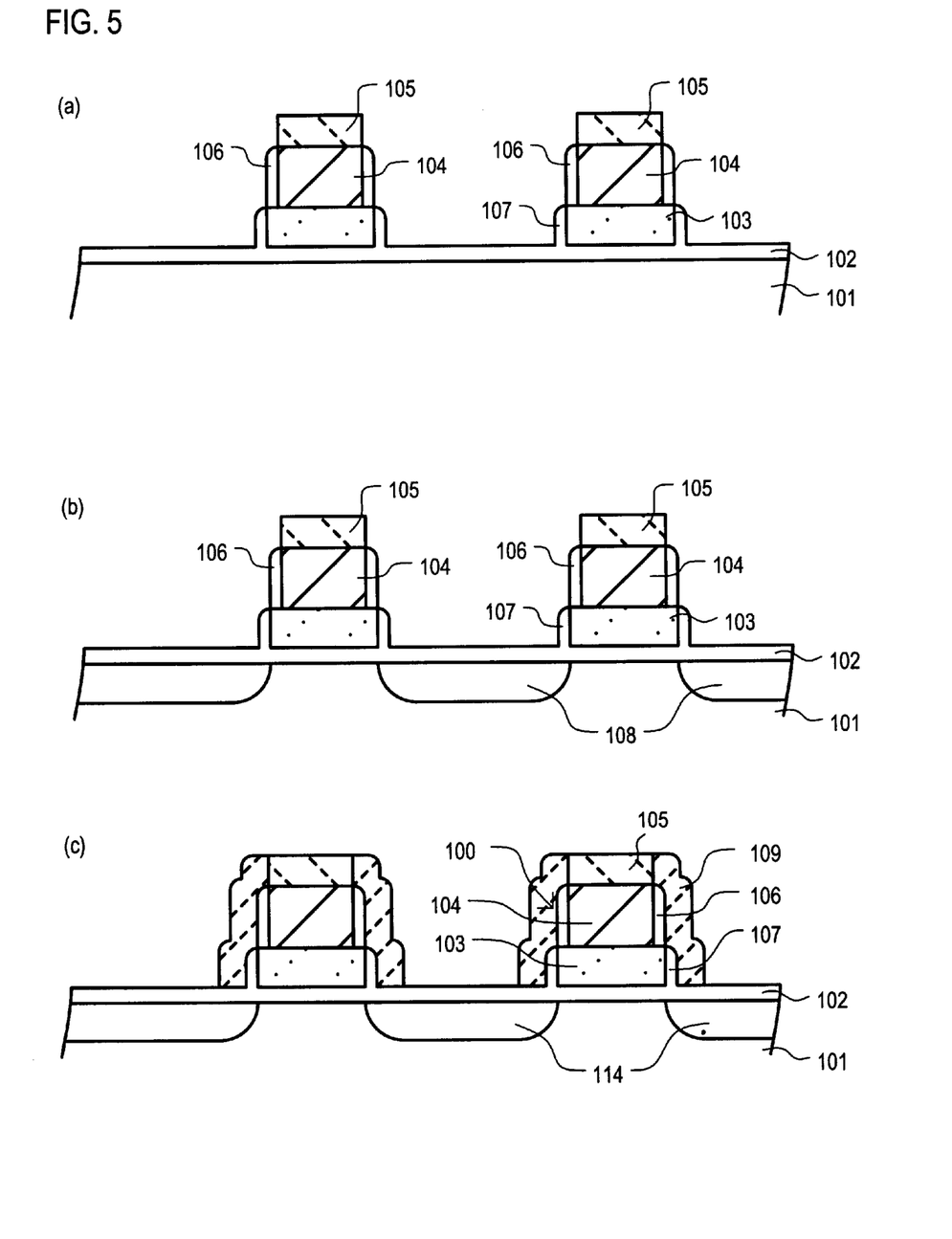
FIG. 5 is cross-sectional views of a semiconductor device according to a second embodiment after various processing steps.
Figure 6:
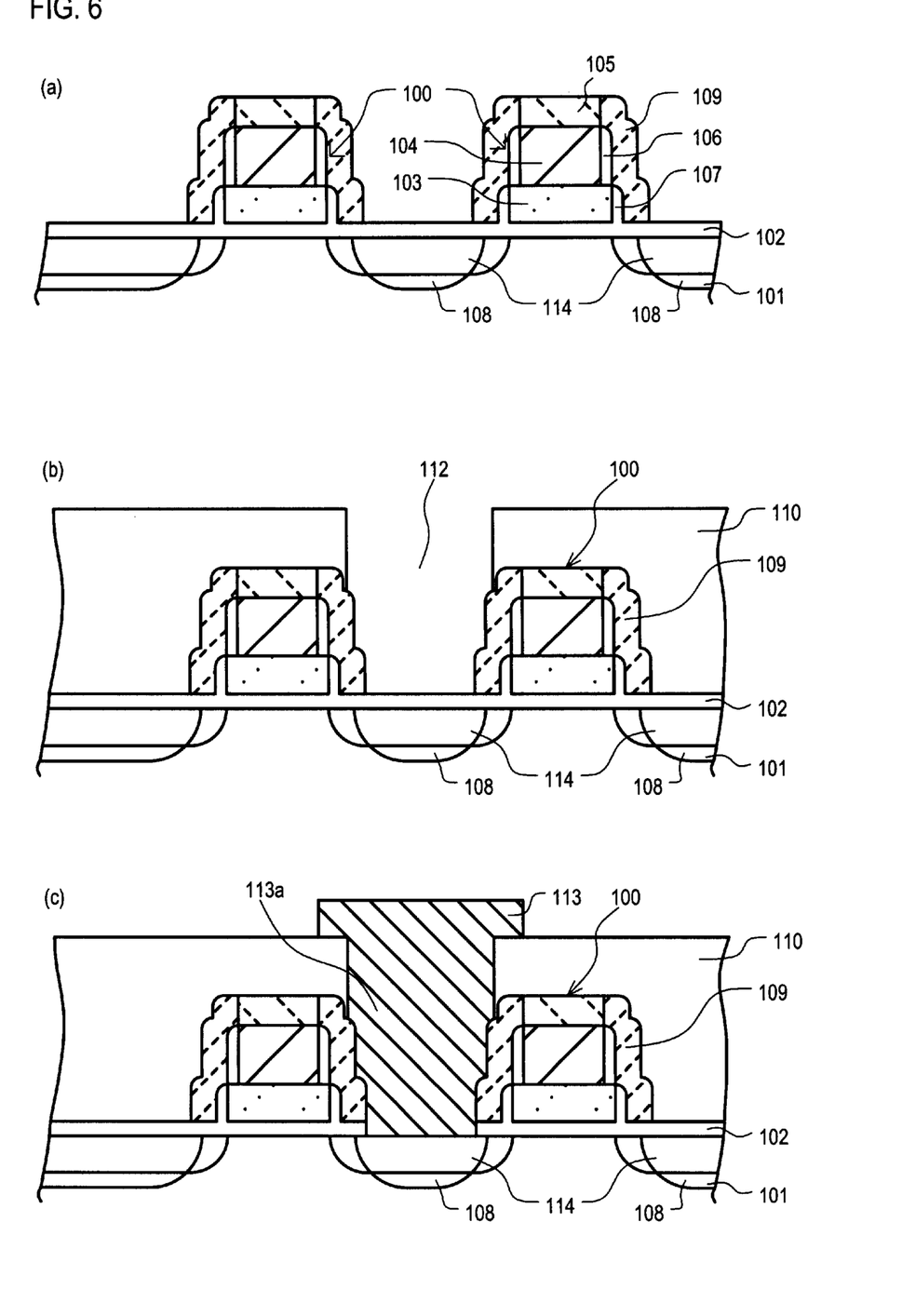
FIG. 6 is cross-sectional views of a semiconductor device according to a second embodiment after various processing steps.

FIGS. 4 to 6 are cross-sectional views of a semiconductor device according to a second embodiment after various processing steps.

Referring now to FIG. 4(a), gate insulating film 102, polysilicon film 103, WSi film 104, and silicon nitride film 105 may be formed on the surface of a silicon substrate 101 in a similar manner as the first embodiment. Silicon nitride film 105 and WSi film 104 may be etched into a predetermined pattern to form cap film 105 and upper layer electrode 104 of a gate electrode.

Referring now to FIG. 4(b), a furnace nitriding (FN) process may be performed to form anti-oxidizing film 106. Anti-oxidizing film may include a silicon nitride film having a thickness of approximately 5 nm on the side surface of upper layer electrode 104. Anti-oxidizing film 106 may be formed so that the FN silicon nitride film may be thinner on the surface of polysilicon film 103 and side surface of cap film 105 than on the side surface of upper layer electrode 104. Thus, the FN silicon nitride film on the surface of polysilicon film 103 is not illustrated. Furnace nitriding conditions may include ammonia ($NH_3$) gas or nitrogen oxide ($NO_2$ or NO) with a flow rate of approximately 10 (liters/minute) at approximately 800 to 1000° C. for approximately 5 to 20 minutes, for example.

Referring now to FIG. 4(c), polysilicon film 103 may be etched in self-alignment with respect to cap film 105, upper layer electrode 104, and side surface anti-oxidizing film 106. The FN silicon nitride film on the upper surface of polysilicon film 103 may be etched and removed at the same time by a method such as anisotropic RIE (reactive ion etch), while cap film 105 and anti-oxidizing film 106 on the side surface of upper layer electrode 104 may not be etched. Also, polysilicon film 103 may remain behind under the upper layer electrode 104 and side anti-oxidizing film 106 to form lower layer electrode 103. In this way, a gate electrode 100 may be formed including cap film 105, upper layer electrode 104, and lower layer electrode 103. The surface of gate insulating film 102 may be etched to reduce the film thickness in a region other than under the lower layer electrode 103.

Referring now to FIG. 5(a), the side surface of lower layer electrode 103 and the surface of gate insulating film 102 may be oxidized with a furnace oxidizing process to form side surface oxide film 107. Also, gate insulating film 102 may be return to essentially its original thickness of about 10 nm. Conditions of furnace oxidization may include an oxygen ($O_2$) gas flow rate of approximately 5 to 10 (liters/minute) at approximately 800 to 1000° C. for about 5 to 10 seconds, for example. Silicon oxide cap film 105 may be formed on the upper surface of upper layer electrode 104 and FN silicon nitride anti-oxidizing film 106 may be formed on the side surface of upper layer electrode 104 so that the upper surface and side surface of upper layer electrode 104 may be prevented from being oxidized. Thus, a thick silicon oxide film may not be formed on the side surface. Even if upper layer electrode 104 is oxidized, silicon oxide film formed here may be so thin that it may be ignored as compared with anti-oxidizing film 107. In this way, gate electrode 100 may be formed with the above-mentioned process.

Referring now to FIG. 5(b), the surface of silicon substrate 101 may be ion implanted with an impurity at low concentration with a self-alignment method using gate electrode 100 as a mask. In this way, LDD regions 114 may be formed.

Referring now to FIG. 5(c), silicon nitride film 109 may be formed over the entire surface with a CVD method. Silicon nitride film 109 may have a thickness of approximately 50 nm and may serve as an etching stopper film 109 covering the upper and side surfaces of gate electrode 100.

CVD silicon nitride film 109 may be subjected to anisotropic etching. In this way, an etching stopper side wall film 109 of CVD silicon nitride may remain on a region that may cover the side surfaces of anti-oxidizing film 106, side surface oxide film 107, and cap film 105.

Referring now to FIG. 6(a), silicon substrate 101 may then be ion implanted with an impurity at a high concentration with a self-alignment method using gate electrode 100 and etching stopper side wall film 109 as a mask. In this way, source/drain regions 108 may be formed.

Referring now to FIG. 6(b), interlayer insulating film 110 may be formed over the entire surface to cover gate electrode 100. Interlayer insulating film may be a BPSG film. A mask (not shown) may be formed having an opening over a region corresponding to a source/drain region 108. Interlayer insulating film 110 may then be etched to form contact hole 112. When the forming of contact hole 112, a selective etching process for oxide film may be performed under conditions of selective etching ratio of the BPSG as interlayer insulating film 110 and silicon nitride as etching stopper side wall film 109. In this way, only interlayer insulating film 110 may be etched without significantly etching the etching stopper side wall film 109.

Also, gate insulating film 102 comprising silicon oxide at the bottom surface of contact hole 112 may be etched. In this way, contact hole 112 may be formed with a SAC method and silicon substrate 101 including source/drain region 108 may be exposed. Accordingly, with the SAC method, even if the opening in the mask is out of position, upper and lower layer electrodes (104 and 103) may be prevented from being exposed in contact hole 112 during the formation of contact hole 112 due to the etching stopper side wall film 109.

Referring now to FIG. 6(c), polysilicon doped with an impurity may be formed on interlayer insulating film 110 including contact hole 112. Polysilicon may be patterned and etched with a mask (not shown) to form a wiring electrode 113. Wiring electrode 113 may include a contact electrode 113a formed in contact hole 112. In this way, contact electrode 113a may provide an electrical connection between source drain region 108 of an insulated gate field effect transistor (IGFET) and wiring electrode 113. The IGFET formed may be a LDD type metal oxide semiconductor field effect transistor (MOSFET), as just one example.

In the semiconductor device including an IGFET as mentioned above, the furnace nitriding and the furnace oxidizing may be performed to form anti-oxidizing film 106 and side surface oxide film 107, which may be different than the first embodiment. However, similar to the first embodiment, side surface oxide film 107 on the side surface of lower layer electrode 103 may protrude from the side of lower layer electrode 103 by its own thickness farther than anti-oxidizing film 106 from the side surface of upper layer electrode 104. Because the side surface of upper layer electrode 104 may be covered with anti-oxidizing film 106, the side surface of upper layer electrode may not be oxidized during the furnace oxidization. In this way, the overhang state in which the side surface of upper layer electrode 104 protrudes beyond the side surface of lower layer electrode 103 may be prevented.

Accordingly, when LDD region 114 is formed by ion implantation of impurity under self-alignment with the upper layer electrode 104, lower layer electrode 103, and anti-oxidizing film 106 and/or side surface oxide film 107, no portion of the desired LDD region 114 in the vicinity of the gate electrode may be shielded so that ions may be prevented from being implanted. Thus, the impurity diffusion resistance of the LDD region 114 in the vicinity of gate electrode may be prevented from increasing. Also, when BPSG interlayer insulating film 110 is formed after CVD silicon nitride etching stopper side wall film 109 that covers gate electrode 100 is formed, a void may not occur in a region close to the gate electrode 100. Even when contact hole 112 and contact electrode 113a are formed, wiring isolation properties of interlayer insulating film 110 may be prevented from suffering adverse affects due to unwanted voids in filling regions. In this way, characteristics of the IGFET formed may be prevented from being adversely affected.

In the second embodiment, when cap film 105 is formed with silicon oxide, cap film 105 may be etched if a mask for the contact hole is out of position. Thus, it may be necessary to form cap film 105 with silicon nitride or a material having a selective etching ratio for silicon oxide.

Figure 7:
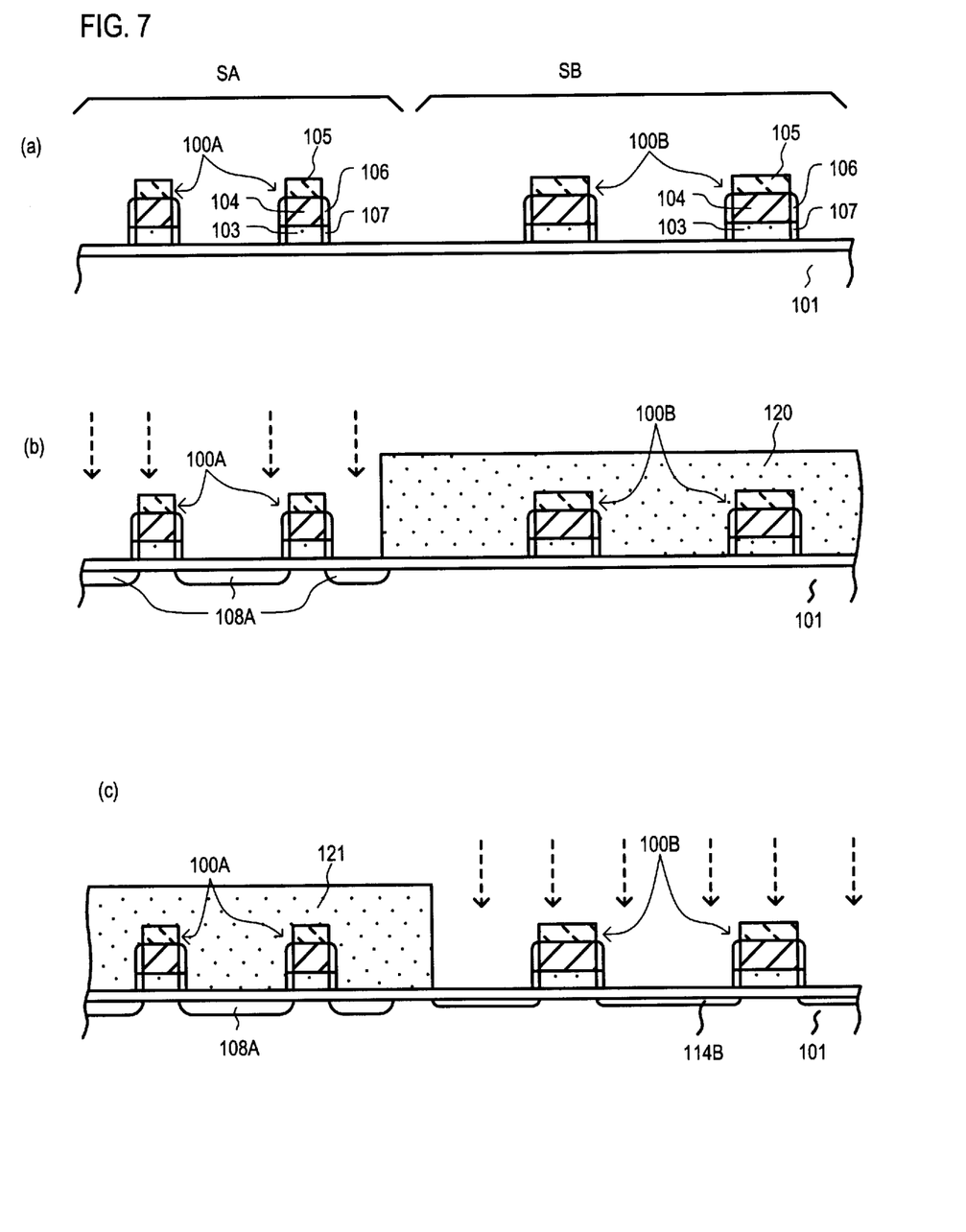
FIG. 7 is cross-sectional views of a semiconductor device according to a third embodiment after various processing steps.
Figure 8:
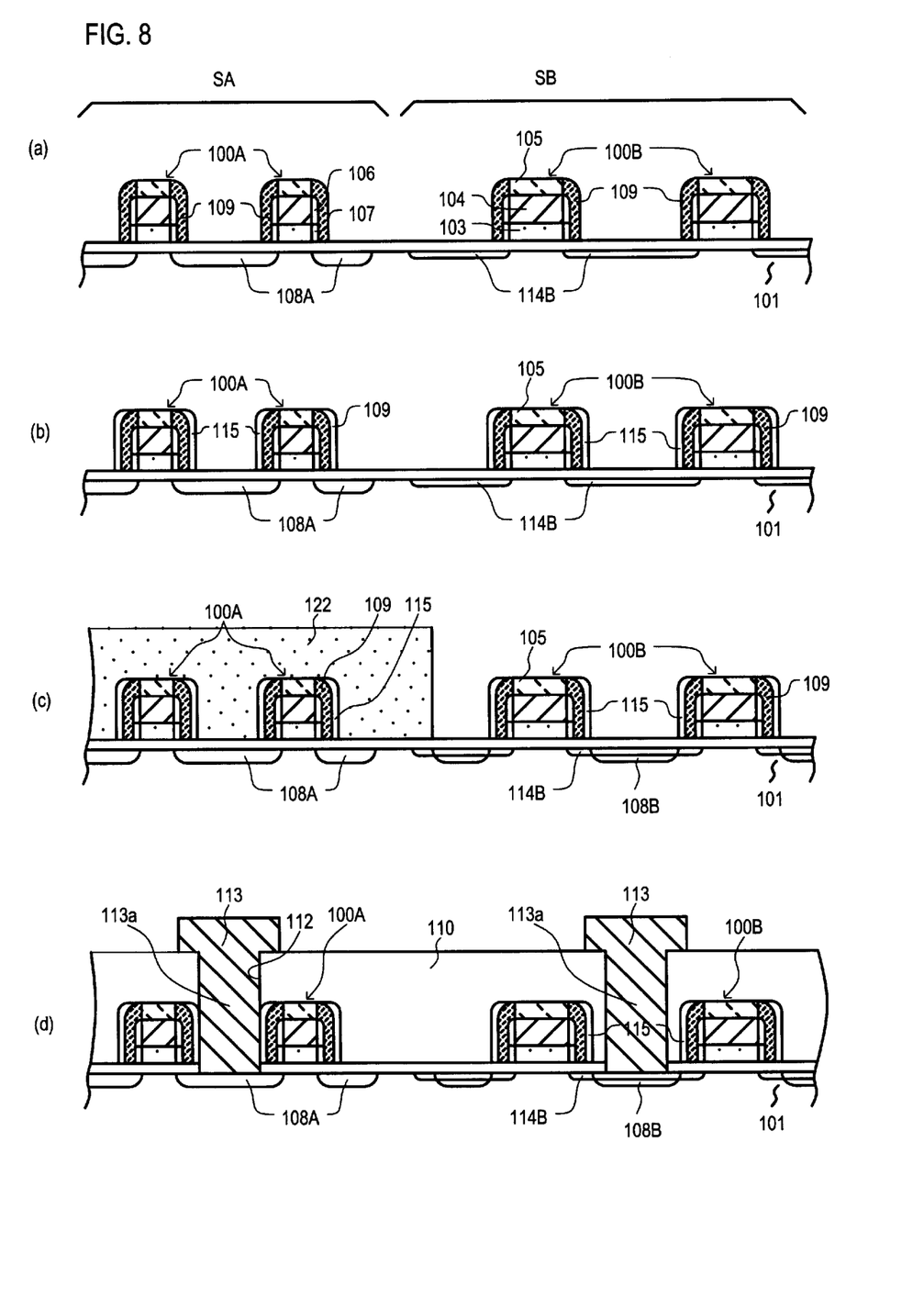
FIG. 8 is cross-sectional views of a semiconductor device according to a third embodiment after various processing steps.

A third embodiment of the present invention will now be described with reference to FIGS. 7 and 8. The third embodiment is an example where the present invention may be applied to an IGFET included in a memory cell and an IGFET in a peripheral circuit. The IGFETs may be MOS transistors, as just one example. Constituents in the second embodiment that are similar to constituents in the first embodiment may be given the same general reference character.

Referring now to FIG. 7(a), semiconductor memory may include a memory cell region SA and a peripheral region SB defined on a substrate 101. Gate electrodes (100A and 100B) of respective IGFETs may be formed in the respective regions in a similar manner as the process of the first embodiment illustrated in FIG. 1(a) to FIG. 2(b). In the respective gate electrodes (100A and 100B), anti-oxidizing film 106 may be formed on side surfaces of cap film 105 and upper layer electrode 104. Side surface oxide film 107 may be formed on the side surface of lower layer electrode 103.

Referring now to FIG. 7(b), peripheral circuit region SB may be covered with mask 120, for example photoresist. Memory cell region SA may then be ion implanted with an impurity at high concentration. Thus, source/drain region 108A may be formed. In this way, an IGFET in a memory cell may be formed in memory cell region SA.

Next, as illustrated in FIG. 7(c), mask 120 may be removed and memory cell region SA may be covered with mask 121, for example photoresist. Peripheral circuit region SB may then be ion implanted with an impurity at a low concentration to form LDD region 114B.

Referring now to FIG. 8(a), mask 121 may be removed and silicon nitride film 109 may be formed over the entire surface with a CVD method to cover upper surfaces and side surfaces of gate electrodes (100A and 100B). Silicon nitride film 109 may be an etching stopper film. CVD silicon nitride film 109 may be subjected to anisotropic etching. In this way, an etching stopper film 109 of CVD silicon nitride may remain on a region that may cover the side surfaces of anti-oxidizing film 106, side surface oxide film 107, cap film 105, and lower electrode 103.

Referring now to FIG. 8(b), a silicon oxide film 115 may be formed over the entire surface using a CVD method to cover gate electrodes (100A and 100B) and etching stopper film 109. CVD silicon oxide film 115 may then be subjected to anisotropic etching so that side wall film 115 may remain on the side surface of etching stopper film 109. Etching stopper film 109 may have a thickness of about 30 nm, which may be thinner than the etching stopper film of the first embodiment or etching stopper side wall film of the second embodiment. Side wall film 115 may be thus formed and may have a thickness of about 20 nm.

Referring now to FIG. 8(c), memory cell region SA may be covered with mask 122, for example photoresist. Peripheral circuit region SB may then be ion implanted with an impurity at a high concentration with a self-alignment method using gate electrode 100B, etching stopper film 109, and side wall film 115 as a mask. In this way, source/drain regions 108B may be formed. Thus, an IGFET having a relatively high operating voltage LDD structure may be formed. An interval between gate electrode 100B and source drain/region 108B (i.e. the size of LDD region 114B) may be the sum of film thicknesses of etching stopper film 109 and side wall film 115.

Referring now to FIG. 8(d), mask 122 may be removed. Interlayer insulating film 110 may be formed over the entire surface to cover gate electrodes (100A and 100B) and provide a flat surface. Interlayer insulating film 110 may be a BPSG film. A mask may be formed having an opening over a region corresponding to a source/drain regions (108A and 108B). Interlayer insulating film 110 may then be etched to form contact holes 112. When the forming of contact holes 112, a selective etching process for oxide film may be performed under conditions of selective etching ratio of the BPSG as interlayer insulating film 110 and silicon nitride as etching stopper film 109. Thus, only interlayer insulating film 110 may be etched without significantly etching the etching stopper film 109. In this way, contact hole 112 may be formed with a SAC method and silicon substrate 101 including source/drain regions (108A and 108B) of the respective IGFETs in memory cell region SA and peripheral region SB may be exposed.

Even if side wall film 115 is etched when the mask is out of position, etching stopper film 109 may inhibit etching so that respective upper layer electrodes 104 and lower layer electrodes 103 of gate electrodes (100A and 100B) may be prevented from being exposed in contact hole 112.

Thereafter and similarly in other embodiments, a desired pattern of conductive material, such as aluminum, may be formed on interlayer insulating film 110 using a sputtering method or the like. A mask and photolithography step may then be performed to obtain wiring electrode 113. A portion of wiring electrode 113 may form contact electrode 113a. A contact electrode 113a may be electrically connected to a source drain region 108A of an IGFET (such as a MOS transistor) included in a memory cell in a memory cell region SA through a contact hole 112. Also, a contact electrode 113a may be electrically connected to a source/drain region 108B of an LDD type IGFET (such as an LDD type MOS transistor) in peripheral region SB through a contact hole 112.

In the semiconductor device as described in the third embodiment, side surface oxide film 107 on the side surface of lower layer electrode 103 may protrude from the side of lower layer electrode 103 by its own thickness farther than anti-oxidizing film 106 from the side surface of upper layer electrode 104. Because the side surface of upper layer electrode 104 may be covered with anti-oxidizing film 106, the side surface of upper layer electrode may not be oxidized. In this way, the overhang state in which the side surface of upper layer electrode 104 protrudes beyond the side surface of lower layer electrode 103 may be prevented.

Accordingly, when source/drain region 108A is formed in memory cell region SA and LDD region 114B is formed in peripheral circuit region SB by ion implantation of impurity under self-alignment with the gate electrodes (100A and 100B), no portion of the desired source/drain region 108A or LDD region 114B in the vicinity of the gate electrodes (100A and 100B) may be shielded so that ions may be prevented from being implanted. Thus, the impurity diffusion resistances of the source/drain region 108A and LDD region 114B in the vicinity of gate electrodes (100A and 100B) may be prevented from increasing. Also, when interlayer insulating film 110 is formed after etching stopper side film 109 and side wall film 115 that covers gate electrodes (100A and 100B) is formed, a void may not occur in a region close to the gate electrodes (100A and 100B). Even when contact hole 112 and contact electrode 113*a* are formed, wiring isolation properties of interlayer insulating film 110 may be prevented from suffering adverse affects due to unwanted voids in filling regions. In this way, characteristics of the IGFET formed may be prevented from being adversely affected.

In the third embodiment, the amount of offset between an edge of LDD region 114B and an edge of source/drain region 108B in an IGFET in the peripheral circuit region SB may be about 50 nm, which is essentially the sum of thickness of etching stopper film 109 and side wall film 115. This may provide an IGFET having a sufficiently high operating voltage characteristics similarly to the first and second embodiments. Because the LDD structure may be formed using a laminated structure of etching stopper film 109 and side wall film 115, etching stopper film 109 may be formed having a smaller thickness than the first and second embodiments. Even if the distance between gate electrodes of an IGFET in memory cell region SA is made smaller, it may be possible to form a sufficient etching stopper film 109 in the IGFET. Even if such a reduced spacing is used, the size of contact hole 112 may be made equal to the spacing of adjacent etching stopper films 109 by etching interlayer insulating film 110 and side wall film 115 to etching stopper film 109 when contact hole 112 is formed to provide an opening to source/drain region 108A of an IGFET in memory cell region SA. In this way, the resistance of contact electrode 113A may not increase.

Although in the embodiments described above, examples including a gate electrode having an upper layer electrode constructed with WSi are disclosed, it may be possible to construct the upper layer electrode with, for example, another metal silicide having a high melting point. Also, it the upper layer electrode may be constructed with a metal such as tungsten (W), for example.

The present invention discloses a structure including a gate electrode of an IGFET (such as a MOS transistor) where a thermal nitride film may be formed on the side surface of upper layer electrode, thereafter the lower layer electrode may be formed using self-alignment with the upper layer electrode and the thermal nitride film. The thermal oxide film may be formed on the side surface of the lower layer electrode. In this way, the side surface of the lower electrode may be formed essentially in alignment with the side surface of the thermal nitride film. Thus, the thermal oxide film on the side surface of the lower layer electrode may protrude by essentially its own thickness further than the thermal nitride film on the side surface of the upper layer electrode.

The side surface of the upper layer electrode may be covered with the thermal nitride film. Thus, the side surface of the upper layer electrode may not be oxidized when the thermal oxide film is formed. In this way, the side surface of the upper layer electrode may be prevented from protruding further than the side surface of the lower layer electrode. Accordingly, portions of the desired source/drain region may not be shielded so that ions may be prevented from being implanted when forming the impurity diffusion layer in self-alignment with the gate electrode. Thus, the impurity diffusion resistance in the vicinity of the gate electrode may be prevented from increasing and operating characteristics of the IGFET (for example, MOS transistor) may be prevented from being adversely affected.

When the interlayer insulating film is formed after the etching stopper film is formed (for example, with a CVD method) to cover the gate electrode, a void may not occur in a region close to gate electrodes. Thus, wiring isolation properties of the interlayer insulating film may be prevented from suffering adverse affects due to undesired voids in filling region. In this way, defects in the semiconductor device may be reduced.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A method for manufacturing a semiconductor device including an insulated gate field effect transistor (IGFET), comprising the steps of:

forming a gate insulating film on a semiconductor substrate;

forming a laminate film on the gate insulating film, the laminate film including an insulating film formed on a second conductive film formed on a first conductive film;

etching the insulating film and second conductive film into a predetermined pattern to form a cap layer and an upper layer gate electrode;

forming a first nitride film, that is a thermal nitride film, on the side surface of the upper layer gate electrode;

etching the first conductive film using the cap layer, upper layer gate electrode, and the nitride film as a mask to form a lower layer gate electrode;

forming a first oxide film on the side surface of the lower layer electrode; and forming an etching stopper film including a second nitride film over the entire surface.

2. The method for manufacturing a semiconductor device of claim 1, wherein:

the first conductive film includes a polysilicon film; and the second conductive film includes a metal film.

3. The method for manufacturing a semiconductor device of claim 1, wherein:

the first conductive film includes a polysilicon film; and the second conductive film includes a metal silicide film having a high melting point.

4. The method for manufacturing a semiconductor device of claim 1, wherein the first oxide film is a thermal oxide film.

5. The method for manufacturing a semiconductor device of claim 1, wherein:

forming the etching stopper film includes forming the second nitride film with a chemical vapor deposition.

6. The method for manufacturing a semiconductor device of claim 1, wherein:

the first nitride film is a thermal nitride film formed with a rapid thermal nitridation step using a lamp as a heat source.

7. The method for manufacturing a semiconductor device of claim 1, further including the steps of:

forming a source/drain region by doping an impurity into the semiconductor substrate after the step of forming the first oxide film; and forming an interlayer insulating film over the entire surface and selectively etching the interlayer insulating film with a selective etching ratio for the etching stopper film to open a contact hole after the step of forming the etching stopper film.

8. The method for manufacturing a semiconductor device of claim 1, further including the steps of:

forming a LDD (lightly doped drain) region by doping a first impurity concentration into the semiconductor substrate after the step of forming the first oxide film;

anisotropic etching the etching stopper film to form a side wall etching stopper film on side surfaces of the lower layer gate electrode, upper layer gate electrode and cap layer; and forming a source/drain region by doping a second impurity concentration into the semiconductor substrate using the side wall etching stopper film as a mask wherein the first impurity concentration is lower than the second impurity concentration.

9. The method for manufacturing a semiconductor device of claim 8, further including the steps of:

forming a second oxide film over the entire surface of the substrate with a chemical vapor deposition method;

anisotropic etching the second oxide film to form a side oxide film on the side surface of the etching stopper film; and forming the source/drain region after the step of forming the side wall.

* * * * *